United States Patent [19]
Lin

[11] Patent Number: 5,920,792
[45] Date of Patent: *Jul. 6, 1999

[54] HIGH DENSITY PLASMA ENHANCED CHEMICAL VAPOR DEPOSITION PROCESS IN COMBINATION WITH CHEMICAL MECHANICAL POLISHING PROCESS FOR PREPARATION AND PLANARIZATION OF INTEMETAL DIELECTRIC LAYERS

[75] Inventor: Chi-Fa Lin, Hsinchu, Taiwan

[73] Assignee: Winbond Electronics Corp, Hsinchu, Taiwan

[ * ] Notice: This patent is subject to a terminal disclaimer.

[21] Appl. No.: 09/045,101

[22] Filed: Mar. 19, 1998

[51] Int. Cl.$^6$ ................................................. H01L 21/00
[52] U.S. Cl. ............................................ 438/633; 438/692
[58] Field of Search .................................. 438/633, 692; 451/41

[56] References Cited

U.S. PATENT DOCUMENTS 5,494,854  2/1996  Jain ......................................... 437/195

FOREIGN PATENT DOCUMENTS 09223737  8/1997  Japan .

OTHER PUBLICATIONS

Wang, Justin, "Advanced Techniquies for interlayer dielctric depostion and planarization", SPIE vol. 2090 Multilevel Interconnection (1993) pp. 85–92.

*Primary Examiner*—Charles Bowers, Jr.
*Assistant Examiner*—Matthew Whipple
*Attorney, Agent, or Firm*—W. Wayne Liauh

[57] ABSTRACT

A wafer planarization process which utilizes combined high density plasma chemical vapor deposition (HDP-CVD) process and chemical mechanical polishing (CMP) process is disclosed. This process includes the steps of (a) forming a first HDP-CVD layer on the surface of a semiconductor wafer using a first HDP-CVD composition having a higher etching/depositing component ratio and thus a lower CMP removal rate; (b) forming a second HDP-CVD layer on the first HDP-CVD layer using the same HDP-CVD process but with a second HDP-CVD composition having a lower etching/depositing component ratio and thus a higher CMP removal rate; and (c) using a chemical mechanical process to remove at least a part of the second HDP-CVD layer using the first HDP-CVD layer as a stopper. A protective layer with the same etching/deposition components but a different ratio than the sacrificial layer can be deposited on the sacrificial layer to minimize the dishing effect during the initial stage of the chemical mechanical polishing process.

11 Claims, 4 Drawing Sheets

HIGH DENSITY PLASMA ENHANCED CHEMICAL VAPOR DEPOSITION PROCESS IN COMBINATION WITH CHEMICAL MECHANICAL POLISHING PROCESS FOR PREPARATION AND PLANARIZATION OF INTEMETAL DIELECTRIC LAYERS

FIELD OF THE INVENTION

The present invention relates to an improved chemical mechanical polishing (CMP) process for the fabrication of ultra-large-scale integration (ULSI) devices. More specifically, the present invention relates to an improved chemical mechanical polishing process for providing and subsequently planarizing a sacrificial layer, which typically comprises silicon dioxide or silicon nitride to provide shallow trench isolation, interlayer dielectrics, intermetal (i.e., between successive metal wiring layers) dielectrics and other insulation layers, so as to provide a planarized surface for the fabrication of multi-level trench oxide isolated ULSI circuit devices. The novel process disclosed in the present invention reduces the fabrication cost while improving the quality of the final product by reducing the chemical vapor deposition time and the CMP time, while improving the uniformity of the CMP polished surface.

BACKGROUND OF THE INVENTION

Recently, in the fabrication of ultra-large scale-integration (ULSI) circuits, vertical stacking, or integration, of metal wiring circuits to form multilevel interconnection has become an efficient way to increase circuit performance and increase the functional complexity of the circuits. One drawback of multilevel interconnection is the loss of topological planarity resulting from various photolithographic and etching processes. To alleviate these problems, the wafer is planarized at various stages in the fabrication process to minimize non-planar topography and thus its adverse effects. Such planarization is typically implemented in the dielectric layers. However, it is possible to implement the planarization process in the conductor layer.

More recently, chemical-mechanical polishing (CMP) processes have become very well received to planarize the wafer surface in preparation for further device fabrication. The CMP process mainly involves the step of holding a semiconductor wafer against a rotating polishing pad surface wetted by a polishing slurry, which typically comprises an acidic or basic etching solution in combination with alumina or silica particles. On the one hand, the liquid portion of the slurry chemically removes, loosens, or modifies the composition of the material on the wafer which is to be removed. On the other hand, the particle portion of the slurry, in combination of the rotating polishing pad, physically removes the chemical modified material from the wafer. Thus, the name "chemical-mechanical polishing" was obtained.

One of the main applications of the CMP process is to planarize the sacrificial layer, which is typically deposited via a chemical vapor deposition technique on a metal wiring layer to facilitate the fabrication of the next metal wiring layer. The sacrificial layer typically comprises silicon dioxide or silicon nitride to provide shallow trench isolation, interlayer dielectrics, intermetal (i.e., between successive metal wiring layers) dielectrics and other insulation layers.

Due to the topography of the device (i.e., the wiring layer) upon which the sacrificial layer is to be deposited, typically via a chemical vapor deposition (CVD) technique, the thickness of the sacrificial layer has to be very high in order to achieve a satisfactorily planarized surface. The requirement of a thick sacrificial layer results in two significant adverse impacts on the manufacturing costs: First it increases the processing time and thus the process cost during the chemical deposition of the sacrificial layer and the subsequent CMP process for the removal thereof in order to achieve planarization. Second, since the CMP process can introduce nonuniformity to the wafer, for example, the dishing effect, the thickness variations in the final CMP polished device may be even greater than before polishing if the wafer has to endure a long CMP processing time. As a result, it is highly desirable to develop a process which could reduce the required sacrificial layer thickness and the polishing time so as to reduce the CMP/CVD processing time, reduce the overall fabrication cost, and improve the uniformity of the polished device.

U.S. Pat. No. 4,671,970, the content thereof is incorporated herein by reference, discloses a process for creating dielectric material filled trenches of diverse widths between active regions of a semiconductor which comprises the steps of forming a first conformal layer of oxidation barrier over the trenches and the active regions; forming a second conformal layer over the oxidation barrier which comprises a material characterized by its ability to withstand etchants and its subsequent convertability to a dielectric; forming a third conformal layer of a dielectric material; selectively removing dielectric material from the active regions, the narrow width trenches, and the perimeter regions of the wide width trenches; converting the material of the second conformal layer to a dielectric; filling the regions of selectively removed dielectric material with a further dielectric material to above the level above the planar of the active regions; and planarizating the substrate to the level of the active regions.

U.S. Pat. No. 5,395,801, the content thereof is incorporated herein by reference, discloses a semiconductor processing method of providing and planarizing an insulting layer on a semiconductor wafer comprising the steps of: (1) providing a conformal layer of insulating material over a semiconductor wafer; (2) providing a blanketing chemical-mechanical polishing protective layer over the conformal layer; and (3) chemical-mechanical polishing through the outermost surface of the blanketing layer and then through conformal layer in a single chemical-mechanical polishing step using a single chemical-mechanical polishing slurry. The protective layer provides the function of restricting material removal from low topographical areas during such chemical-mechanical polishing.

U.S. Pat. No. 5,532,191, the content thereof is incorporated herein by reference, discloses a method for planarization an insulating layer comprising the steps of: (1) forming an insulating film on a substrate by chemical vapor deposition using an organic silicon compound, coating a solution of an insulating substance on the substrate and coating a solution of a precursor of an insulating substance on the substrate; (2) forming a protective film having a chemical mechanical polishing etching speed slower than that of the insulating film by depositing silicon oxide and silicon oxynitride via chemical vapor deposition using an inorganic silicon compound as a raw material; and (3) etching back the insulating film by chemical mechanical polishing using the protective film as an etching stop.

The processes disclosed in the above mentioned references either increased the complexity of the CMP process or did not significant reduce the required thickness of the sacrificial insulating layer nor the CMP processing time. Due to the importance of CMP processes in the microelectronic industry, further research efforts are desired for improvements.

SUMMARY OF THE INVENTION

The primary object of the present invention is to develop an improved chemical mechanical polishing process for the fabrication of ULSI devices. More specifically, the primary object of the present invention is to develop an improved chemical mechanical planarization technique, which combines a novel high density plasma enhanced chemical vapor deposition (HDP-CVD) technique with the conventional chemical mechanical polishing (CMP) technique so as to reduce the required thickness of the sacrificial insulation layer during the wafer planarizing step. The process disclosed in the present invention reduces the chemical vapor deposition time and the CMP time, and improves the uniformity of the CMP polished surface. Thus, the present invention provides the advantages of reducing the fabrication cost while improving the quality of the final product.

In the process disclosed in the present invention, a first sacrificial layer of low CMP removal rate is initially deposited on the uneven surface of the wafer via a high density plasma chemical vapor deposition technique using a lower ratio of etching gas and deposition gas in the chemical vapor deposition composition. The low CMP removal rate of the first sacrificial layer also provides a better trench filling capability (i.e., it can more effectively fill trenches of smaller width). The first sacrificial layer should cover all the uneven surfaces of the wafer to be polished. Then, a second sacrificial layer of high CMP removal rate is deposited on the first sacrificial layer. The second sacrificial layer of high CMP removal rate is formed with the same chemical vapor deposition process but using a higher ratio between the etching gas and the deposition gas in the chemical vapor deposition composition.

In the present invention, because a sacrificial layer of low CMP removal rate is provided immediately above the wafer surface, the recessed areas, or trenches, within the chip are protected and the dishing effect is minimized during the initial stage of the CMP polishing process. As the CMP process begins, the relatively small area with high topography will face an initially higher down force and will be removed at a favorably higher rate. As the CMP process progresses, the effective CMP contact area increases and the removal rate per unit area will also decrease. However, the use of a high CMP removal rate sacrificial layer as the second sacrificial layer helps improving the overall removal rate. Near the end of the CMP process, the first sacrificial layer is exposed which then serves as a CMP stopper to prevent over polishing. The increased effective contact area resulting from the use of the high CMP removal rate first sacrificial layer, combined with the use of the first sacrificial layer as the CMP stop layer, greatly improves the overall CMP efficiency and the degree of planarization.

The process disclosed in the present invention can be summarized as comprising the following steps:

(a) Selecting an HDP-CVD composition comprising an etching component and a deposition component, the HDP-CVD composition is provided such that a higher ratio of the etching component relative to the depositing component will result in a lower removal rate during a subsequent CMP process of a CVD layer after the CVD layer is deposited on a substrate via a HDP-CVD process;

(b) Forming a first HDP-CVD layer on the substrate via a HDP-CVD process using the HDP-CVD composition as described in step (a) with a higher etching/depositing component ratio and thus a lower CMP removal rate;

(c) Forming a second HDP-CVD layer on the first HDP-CVD layer using the same HDP-CVD process and the same HDP-CVD composition as described in step (b) except with a lower etching/depositing component ratio and thus a higher CMP removal rate; and (d) Using a chemical mechanical process to remove at least a part of the second HDP-CVD layer utilizing the first HDP-CVD layer as a stopper.

In another preferred embodiment, a third HDP-CVD layer of very thin thickness can be further formed on the second HDP-CVD layer before the CMP process commences. The third HDP-CVD layer has a high etching/depositing component ratio (which would correspond to a low CMP removal rate) so as to serve as a CMP passive or protective layer to protect recessed areas (of the second HDP-CVD layer) from being subjected to the dishing effect of the erosive chemicals during the initial stage of the CMP process.

One of the main advantages of the present invention is that the sacrificial layer (the second HDP-CVD layer) and the stopper layer (the first HDP-CVD layer) contain the same etching and deposition components, except that the ratio between the etching gas and the depositing gas is adjusted. Thus, a same composition can be used for both layers; this element eliminates the need for extra process cost. In the present invention, the stopper layer is also called the first sacrificial layer, because it contains the same composition as the second, or main, sacrificial layer. In a preferred embodiment, the etching component is argon and the deposition component is silane, $SiH_4$, and the sacrificial layers so formed are silicon dioxide, silicon nitride, or other dielectric layers. It should be noted that in the present invention, the term "deposition gas" narrowly means silicon-contain deposition gas. Other deposition gas or gases (such as oxygen- or nitrogen containing gases) which will constitute a part of the dielectric layer may be introduced and varied during the CVD process; it is the silicon-containing deposition gas that should be kept the same. Of course, if the technology advances, the deposition gas may be other than silicon-containing gas. For example, the dielectric layer can be boron nitride (BN). In that case, the deposition component will be a boron-containing gas. The change in the HDP-CVD composition may require an adjustment in the RF power to achieve the intended results.

Another advantage of the present invention is that the HDP-CVD composition with a higher etching/deposition component ratio also provides a better trench, or gap, filling capability. The low CMP removal rate of the HDP-CVD composition with a higher etching/deposition component ratio also allows it to serve as an embedded polishing stop layer to minimize polishing time and reduce non-uniformity. Thus, the present invention provides the benefits of improved chip product with little or no requirement in the modification of the fabrication equipment while reducing the fabrication time and reducing the manufacturing cost.

In summary, the present invention utilizes a very novel approach which forms the stop layer and the sacrificial layer using the same etching/deposition components but at different ratios. This approach requires little or no additional process cost, poses no contamination concerns, involves very few additional process steps or material matching problems, and can be effortlessly integrated into any standard IC process.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
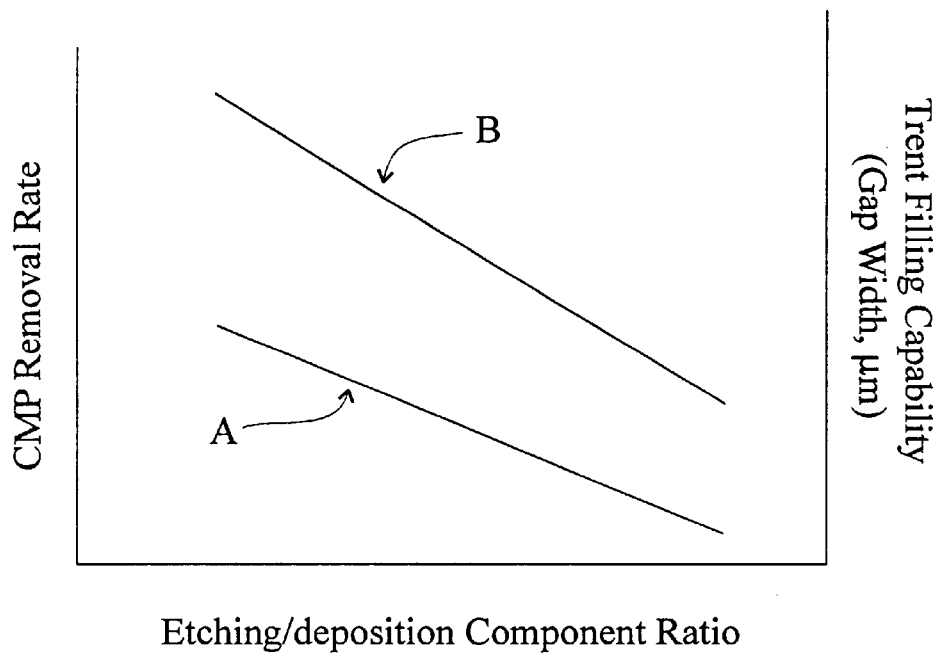
FIG. 1 contains illustrative plots of CMP removal rate and trenching filling capability (in terms of the smallest gap that can be filled under normal conditions) vs. the ratio of etching gas and deposition gas.

The present invention discloses an improved chemical mechanical polishing process for the planarization of the wafer surface during the fabrication of ULSI devices. In the process disclosed in the present invention, a stop layer, which is also called the first sacrificial layer, of low CMP removal rate is deposited on the uneven surface of the wafer via a high density plasma chemical vapor deposition technique. The low CMP removal rate of the first sacrificial layer also provides better trench filling capability which can more effectively fill trenches of smaller width. Thereafter, the main sacrificial layer, which is also called the second sacrificial layer, of high CMP removal rate is deposited on the first sacrificial layer. In the present invention, the stop layer and the main sacrificial comprise the same composition except that their etching/deposition component ratios are different. It should be noted that while the stop layer is also called the first sacrificial layer, very little of it is removed during the CMP process. However, it is called as a sacrificial layer because it contains the same components as the main, or the second, sacrificial layer.

The process disclosed in the present invention, which combines a novel high density plasma chemical vapor deposition (HDP-CVD) process with a conventional chemical mechanical polishing (CMP) process can be summarized as comprising the following steps:

(a) Selecting an HDP-CVD composition which comprises an etching component and a deposition component in such a manner that a low ratio of the etching component over the depositing component will result in a higher removal rate, and a high ratio of the etching component over the depositing component will result in a lower removal rate, during a subsequent CMP process;

(b) Forming a first sacrificial layer, or the first HDP-CVD layer, on a substrate via a HDP-CVD process using the HDP-CVD composition as described in step (a) having a higher etching/depositing component ratio and thus a lower CMP removal rate;

(c) Forming a second sacrificial layer, or the second HDP-CVD layer, on the first sacrificial layer using the same HDP-CVD process and the same HDP-CVD composition as described in step (b) except that the HDP-CVD composition contains a lower etching/depositing component ratio and thus a higher CMP removal rate; and (d) Using a chemical mechanical process to remove at least a part of the second HDP-CVD layer using the first HDP-CVD layer as a stopper.

Alternatively, the process of the present invention further comprises step (e) in which a passive layer, or a third HDP-CVD layer, of very thin thickness is formed on the second HDP-CVD layer before the CMP process. The third HDP-CVD layer has a high etching/depositing component ratio and low CMP removal rate to protect the recessed area of the second sacrificial layer from dishing effect during the initial stage of the CMP process.

In the present invention, because a sacrificial layer of low CMP removal rate is provided immediately above the wafer surface, the recessed areas, or trenches, within the chip are protected and the dishing effect is minimized during the initial stage of the CMP polishing process. At the beginning of the CMP process, the relatively small area with high topography will be subject to an initially higher down force and will be removed at a favorably higher rate. As the CMP process progresses, the effective CMP contact area increases and the removal rate per unit area will decrease. However, the use of a high CMP removal rate sacrificial layer as the second sacrificial layer (which is the main sacrificial layer since the first so-called sacrificial layer will be subject to very little removal) helps maintaining the overall removal rate at a relatively high level. Near the end of the CMP process, a portion of the first sacrificial layer is exposed which serves as a CMP stopper to prevent over polishing. Again, the stop layer is called the first sacrificial layer in the present invention because it contains the same components as the main sacrificial layer. The increased effective contact area resulting the use of the high CMP removal rate first sacrificial layer combined with the use of the first sacrificial layer as the CMP stop layer greatly improves the overall CMP efficiency and the degree of planarization.

In a preferred embodiment, the etching gas during the chemical vapor deposition process is argon and the deposition gas is $SiH_4$, and the sacrificial layers so formed are silicon dioxide layers. However, other dielectric layers such as silicon nitride layers may also be deposited using the method disclosed in the present invention. One of the main advantages of the present invention is that the sacrificial layer (the second HDP-CVD layer) and the stopper (the first HDP-CVD layer) contain the same components, except that their etching/deposition components ratios are different. This greatly minimizes the need for any increased manufacturing cost, which usually accompanies any improvement in quality. Using the stopper composition as the first sacrificial layer also allows the deposited surface to be relatively uniform even before the CMP process. However, if the stopper composition were used as the main sacrificial layer, either a very slow CMP removal rate will be encountered or a more potent CMP process will be required.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

FIG. 1 contains illustrative plots of CMP removal rate, shown as curve A, and trenching filling capability (in terms of the smallest gap that can be filled under normal conditions), shown as curve B, vs. the ratio of etching gas (Ar) and deposition gas ($SiH_4$) for a preferred embodiment of the HDP-CVD composition selected for the present invention. As shown in FIG. 1, as the ratio of etching gas/deposition gas increases, the CMP removal rate decreases. So does the gap size that can be filled (smaller gap size indicating more efficient gap filling capability).

Figure 2:
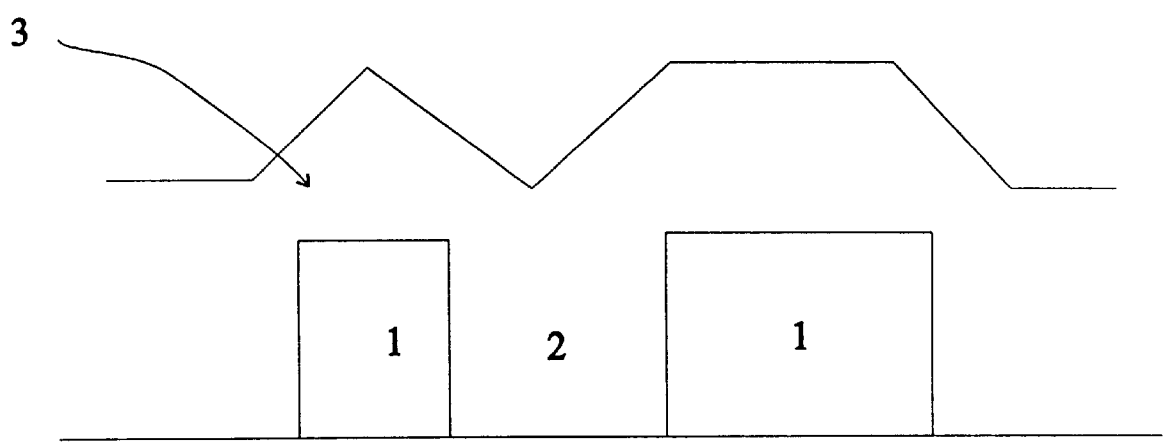
FIG. 2 is a schematic diagram showing the first step of a preferred embodiment of the process of the present invention in which a HDP-CVD composition with a higher etching/depositing component ratio is deposited on the wafer surface via a HDP-CVD technique to form a stop layer and fill the gap.

FIG. 2 is a schematic diagram showing the first step of a preferred embodiment of the process of the present invention in which a HDP-CVD composition with a high etching/depositing component ratio was deposited on the wafer surface via a HDP-CVD technique to form a first sacrificial layer, or stop layer, 3, which covers the metal wiring 1 and fills the gaps 2.

Figure 3:
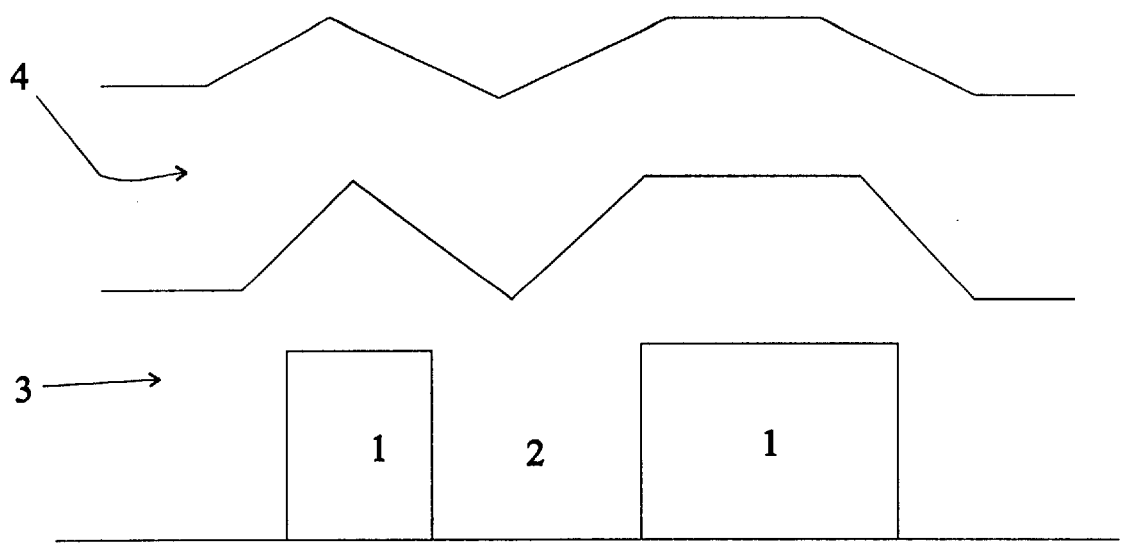
FIG. 3 is a schematic diagram showing that a HDP-CVD composition with a low etching/depositing component ratio is deposited on the stopper layer via the same HDP-CVD technique to form a sacrificial layer.

FIG. 3 is a schematic diagram showing that a HDP-CVD composition with a low etching/depositing component ratio was deposited on the stopper layer 3 via the same HDP-CVD technique to form a second, or main, sacrificial layer 4.

Figure 4:
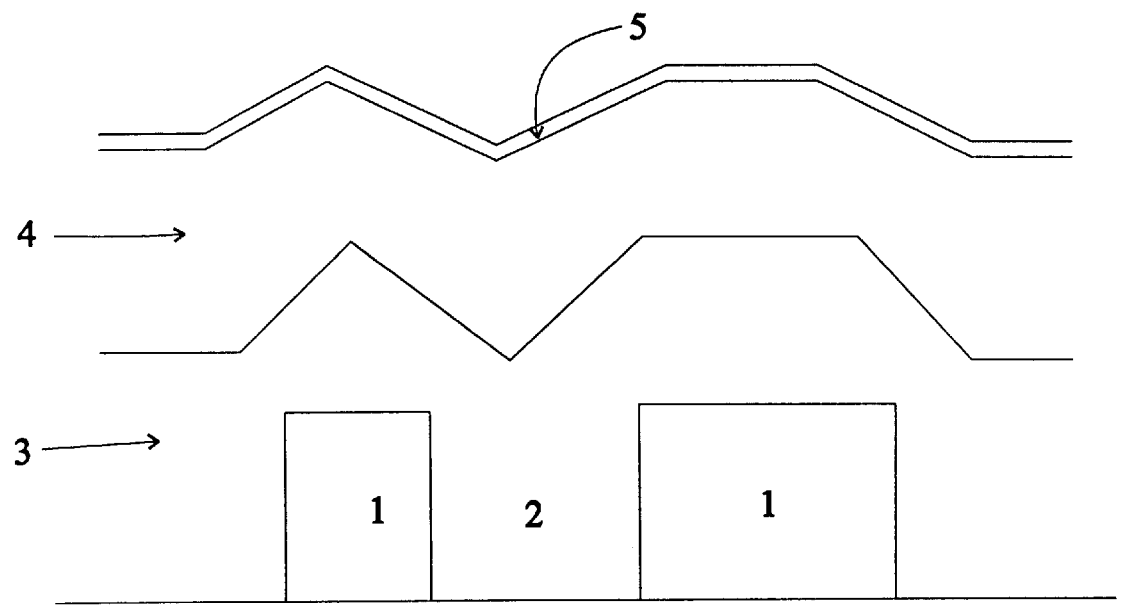
FIG. 4 is a schematic diagram showing that a thin HDP-CVD composition with a high etching/depositing component ratio is deposited on the sacrificial layer via the same HDP-CVD technique to form a CMP passive layer.

FIG. 4 is a schematic diagram showing that another HDP-CVD composition with high etching/depositing component ratio was deposited on the main sacrificial layer via the same HDP-CVD technique to form a thin CMP passive layer 5.

Figure 5:
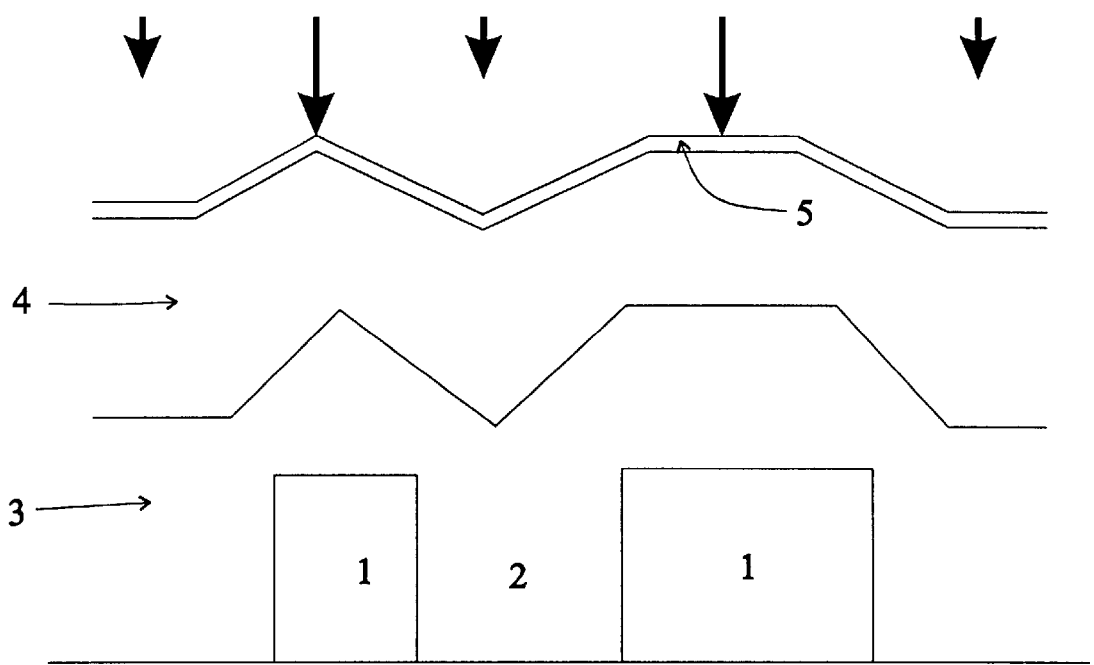
FIG. 5 is a schematic diagram showing that a relatively higher polishing force is acting on the small area with high topography during the initial stage of the CMP process.

FIG. 5 is a schematic diagram showing that a relatively higher polishing force, shown as vertical arrows, was acting on the small area with high topography during the initial stage of the CMP process, the CMP passive layer 5 serves as a protective layer for the recessed areas again any dishing effect. In other words, the recessed areas will be subject to lowest CMP removal because of the lower CMP downward force and the fact that the are protected by the thin passive layer.

Figure 6:
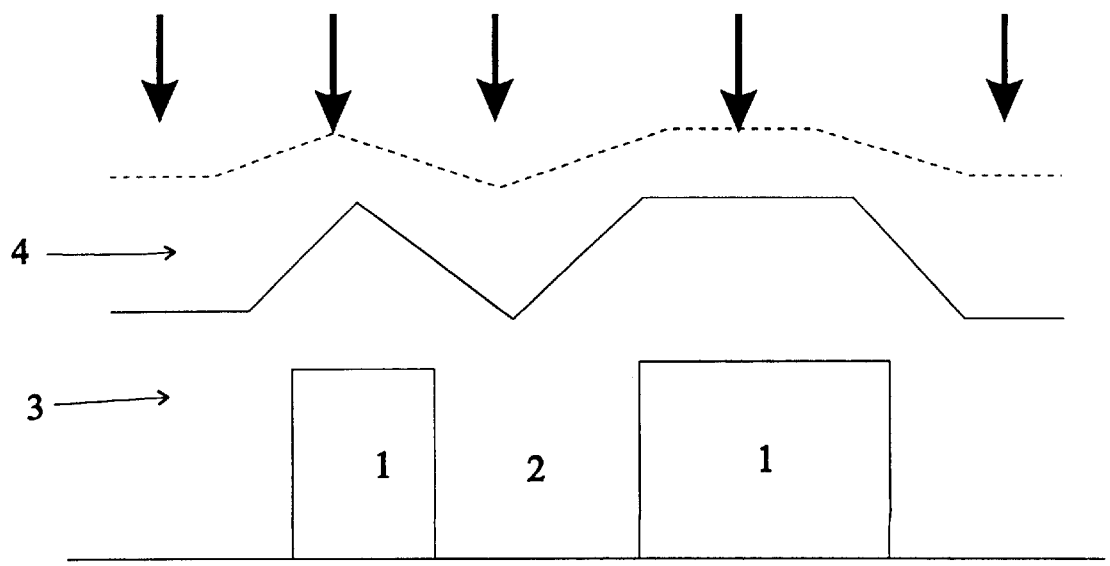
FIG. 6 is a schematic diagram showing that, as the CMP process progresses, a relatively uniform polishing force is acting on the entire area of the sacrificial layer.

FIG. 6 is a schematic diagram showing that, as the CMP process progressed, a relatively uniform polishing force was acting on the entire area of the main sacrificial layer 4.

Figure 7:
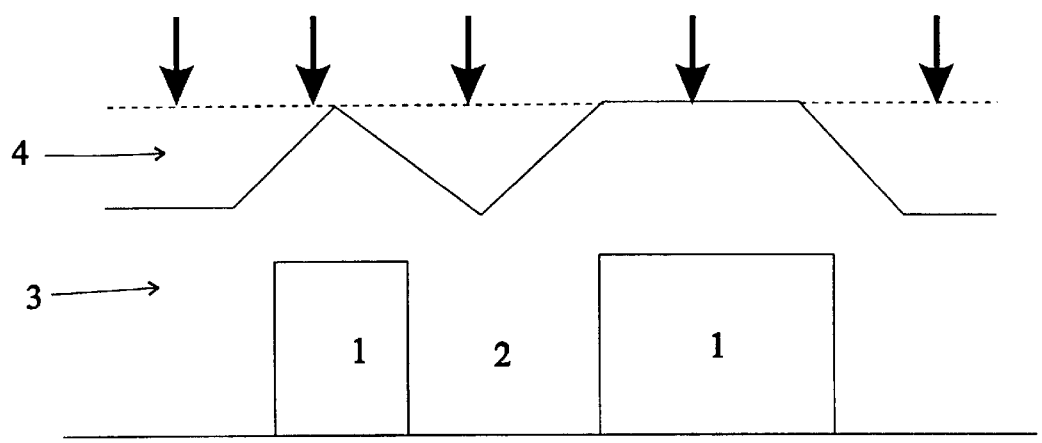
FIG. 7 is a schematic diagram showing that how the stop layer works at the end of the CMP process.

FIG. 7 is a schematic diagram showing that how the stop layer 3 works at the end of the CMP process. The shorter down arrows indicate equal but lower CMP down forces are applied on the planarized surface.

As discussed above, the process disclosed in the present invention utilizes the same etching and deposition gases to form both the stop layer and the sacrificial layer, the only difference being that the ratio of etching/deposition components is changed from a high value for the stop layer to a low value for the sacrificial layer. The same etching/deposition components are also used to provide a CMP passive layer. The present invention allows the thickness of the sacrificial layer to be minimized while greatly improving the efficiency of planarization at the same or even reduced cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A wafer planarization process for planarizing a semiconductor wafer surface by combining a high density plasma chemical vapor deposition (HDP-CVD) process with a chemical mechanical polishing (CMP) process, said process comprising the steps of:

(a) selecting an HDP-CVD composition containing a predetermined etching component and a predetermined deposition component such that a higher etching/deposition component ratio will generally result in a slower removal rate by a subsequent CMP process of an HDP-CVD layer after said HDP-CVD layer is deposited on a substrate, and a lower etching/deposition component ratio will generally result in a faster removal rate;

(b) forming a first HDP-CVD layer on the substrate via an HDP-CVD process using a first HDP-CVD composition, which contains said etching component and said deposition component having a high etching/depositing component ratio and thus a low CMP removal rate;

(c) forming a second HDP-CVD layer on the first HDP-CVD layer using the same HDP-CVD process but with a second HDP-CVD composition, wherein said second HDP-CVD composition contains the same etching and deposition components but with a lower etching/depositing component ratio and thus a higher CMP removal rate relative to said first HDP-CVD composition; and (d) using a chemical mechanical process to remove at least a part of said second HDP-CVD layer using said first HDP-CVD layer as a stopper.

2. The wafer planarization process according to claim 1 which further comprises the step of forming a third HDP-CVD layer on said second HDP-CVD layer using the same HDP-CVD process but with a third HDP-CVD composition, wherein said third HDP-CVD composition contains the same etching and deposition components but with a higher etching/depositing component ratio and thus a lower CMP removal rate relative to said second HDP-CVD composition, so as to allow said third HDP-CVD layer to serve as a protective layer during an initial stage of said CMP process.

3. The wafer planarization process according to claim 1 wherein said HDP-CVD composition comprises Ar as said etching gas and $SiH_4$ as said deposition gas.

4. The wafer planarization process according to claim 1 wherein said HDP-CVD composition is selected such that a high etching/deposition component ratio will also result in a more efficient gap filling capability of said HDP-CVD composition.

5. A wafer planarization process for planarizing a semiconductor wafer surface comprising the steps of:

(a) forming a stop layer on the wafer surface via chemical vapor deposition process;

(b) forming a sacrificial layer on said stop layer using the same chemical vapor deposition process; and (c) using a chemical mechanical polishing process to remove at least a part of said sacrificial layer using said stop layer as a stopper;

(d) wherein said stop layer and said sacrificial layer are formed during said chemical vapor deposition process using the same etching and deposition components but with different etching/deposition component ratios such that said stop layer has a slower removal rate when subject to said chemical mechanical polishing process relative to said sacrificial layer.

6. The wafer planarization process according to claim 5 which further comprises the step of forming a protective layer on said sacrificial layer using the same chemical vapor deposition process against any dishing effect.

7. The wafer planarization process according to claim 6 wherein said protective layer is formed using the same etching and deposition components as said stop and sacrificial layers but with a slower removal rate by said chemical mechanical polishing process relative to said sacrificial layer.

8. The wafer planarization process according to claim 5 wherein said chemical vapor deposition process is a high density plasma enhanced chemical vapor deposition process.

9. The wafer planarization process according to claim 5 wherein said chemical vapor deposition process uses argon as said etching component and $SiH_4$ as said deposition component.

10. The wafer planarization process according to claim 5 wherein said etching component and said deposition component are selected such that said stop layer has a better gap filling capability than said sacrificial layer.

11. The wafer planarization process according to claim 5 wherein said etching component and said deposition component are selected such that said stop layer is formed during said chemical vapor deposition process using a high ratio of etching/deposition components than said sacrificial layer.

* * * * *